United States Patent
Fanget et al.

(10) Patent No.: US 10,003,008 B2
(45) Date of Patent: Jun. 19, 2018

(54) DEVICE WITH A CONTROLLED DISPLACEMENT MEMBRANE

(71) Applicant: COMMISSARIAT A L'ENERGIE ATOMIQUE ET AUX ENE ALT, Paris (FR)

(72) Inventors: Stephane Fanget, Le Grand Lemps (FR); Remy DeJaeger, Eveux (FR); Philippe Robert, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 295 days.

(21) Appl. No.: 14/134,356

(22) Filed: Dec. 19, 2013

(65) Prior Publication Data
US 2014/0177881 A1   Jun. 26, 2014

(30) Foreign Application Priority Data
Dec. 20, 2012   (FR) .................................... 12 62378

(51) Int. Cl.
*H01L 41/09*   (2006.01)
*H04R 3/00*   (2006.01)
(Continued)

(52) U.S. Cl.
CPC .......... *H01L 41/09* (2013.01); *H01L 41/0825* (2013.01); *H04R 3/002* (2013.01);
(Continued)

(58) Field of Classification Search
CPC ... H01L 41/0825; H01L 41/083; H01L 41/09; H04R 17/005; H04R 3/007; H04R 1/02; H04R 1/005; H04R 17/00; H04R 1/406
(Continued)

(56) References Cited

U.S. PATENT DOCUMENTS 3,821,473 A  *  6/1974  Mullins ................. H04R 3/002
                                                        381/96
6,314,823 B1 * 11/2001  Okada .................. B81B 3/0021
                                                        73/862.043
(Continued)

FOREIGN PATENT DOCUMENTS

GB   2 089 171 A   6/1982

OTHER PUBLICATIONS

French Preliminary Search Report dated Sep. 20, 2013, in French Application No. 12 62378 filed Dec. 20, 2012 (with English Translation of Categories of Cited Documents), 2 pages.
(Continued)

*Primary Examiner* — Davetta W Goins
*Assistant Examiner* — Jasmine Pritchard
(74) *Attorney, Agent, or Firm* — Oblon, McClelland, Maier & Neustadt, L.L.P.

(57) ABSTRACT

Membrane device comprising a support, a membrane suspended on the support, a first actuator in contact with the membrane designed to apply a force on the membrane, a second actuator in contact with the membrane designed to apply a force on the membrane, means of determining the position of the membrane relative to the support and control means of the first and second actuators, said control means applying a deformation signal to one of the first and second actuators to deform the membrane and applying a control signal to the other of the first and second actuators to control displacement of the membrane, application of the control signal being determined by the membrane position.

19 Claims, 7 Drawing Sheets

(51) Int. Cl.
*H04R 19/00* (2006.01)
*H01L 41/08* (2006.01)
*H04R 17/00* (2006.01)
*H04R 1/00* (2006.01)

(52) U.S. Cl.
CPC .......... *H04R 17/00* (2013.01); *H04R 19/005* (2013.01); *H04R 1/005* (2013.01)

(58) Field of Classification Search
USPC .......... 381/36, 150, 114, 173, 431; 310/300, 310/311
See application file for complete search history.

(56) References Cited

U.S. PATENT DOCUMENTS

| | | | | |
|---|---|---|---|---|
| 6,807,279 | B1 | 10/2004 | Kyono | |
| 7,538,477 | B2* | 5/2009 | Fazzio | G01H 11/08 310/334 |
| 7,903,830 | B2* | 3/2011 | Hansen | B06B 1/0292 381/174 |
| 8,644,527 | B2* | 2/2014 | Fujise | H04R 3/04 381/114 |
| 8,967,965 | B1* | 3/2015 | Colasante | G10K 9/122 294/185 |
| 2002/0015507 | A1* | 2/2002 | Harris | H04R 7/045 381/431 |
| 2005/0025317 | A1* | 2/2005 | Fedigan | H04R 9/063 381/59 |
| 2006/0279174 | A1* | 12/2006 | Oliver | B06B 1/0292 310/338 |
| 2007/0041273 | A1* | 2/2007 | Shertukde | A61B 5/0408 367/149 |
| 2009/0060213 | A1* | 3/2009 | Bachmann | H04R 3/002 381/59 |
| 2009/0110217 | A1* | 4/2009 | Yasuda | H03H 15/00 381/120 |
| 2012/0043855 | A1* | 2/2012 | Kang | G01C 19/56 310/329 |
| 2012/0099404 | A1* | 4/2012 | Funasaka | G01H 11/08 367/137 |
| 2012/0177211 | A1* | 7/2012 | Yamkovoy | G01D 5/2417 381/59 |
| 2013/0049535 | A1* | 2/2013 | Kim | G10K 9/22 310/322 |
| 2013/0100776 | A1* | 4/2013 | Karl | G01H 13/00 367/137 |
| 2013/0163767 | A1* | 6/2013 | Gauger, Jr. | H04R 29/003 381/55 |
| 2013/0294636 | A1* | 11/2013 | Cassett | H04R 1/02 381/386 |
| 2014/0022026 | A1* | 1/2014 | Onishi | H04R 17/00 331/154 |
| 2014/0177881 | A1 | 6/2014 | Fanget et al. | |
| 2014/0241550 | A1* | 8/2014 | Sunahara | G10K 9/122 381/190 |
| 2014/0292149 | A1* | 10/2014 | Zou | G10K 9/122 310/335 |
| 2015/0145374 | A1* | 5/2015 | Xu | B06B 1/0644 310/317 |
| 2015/0155470 | A1* | 6/2015 | Mori | G06F 3/016 310/326 |
| 2015/0188029 | A1* | 7/2015 | Lim | H01L 41/1132 310/332 |
| 2015/0258574 | A1* | 9/2015 | Lin | B06B 1/0644 310/334 |

OTHER PUBLICATIONS

Thor Bakke, et al., "A novel ultra-planar, long-stroke and low-voltage piezoelectric micromirror", Journal of Micromechanics and Microengineering, Institute of Physics Publishing, Bristol, GB, vol. 20, No. 6, Jun. 1, 2010, 7 pages.

U.S. Appl. No. 13/887,707, filed May 6, 2013, U.S. Pat. No. 2013-0294636, Casset et al.

R. Robin, et al., "Low Actuation Voltage SPDT RF MEMS K Band Switch using a single Gold Membrane", IEEE 2009—MEMS 2009, IEEE 22nd International Conference on Micro Electro Mechanical Systems, 2009, pp. 872-875.

U.S. Appl. No. 14/720,282, filed May 22, 2015, Robert, et al.

* cited by examiner

DEVICE WITH A CONTROLLED DISPLACEMENT MEMBRANE

TECHNICAL FIELD AND PRIOR ART

This invention relates to a device comprising a membrane with controlled displacement, particularly suitable for making a digital speaker.

A suspended membrane is useful in particular for making a pressure sensor or a pressure generator such as an electroacoustic transducer.

The digital speaker comprises a set of small electroacoustic transducers called "speaklets" that are arranged in matrix form. Each speaklet emits pressure pulses at a frequency called the "reconstruction frequency".

With the MEMS technology, a large number of speaklets can be manufactured on a small area giving a non-zero inter-speaklet distance.

Acceleration of the membrane of each speaklet must be precisely controlled if the sound is to be satisfactorily reproduced.

The document by Bakke et al. "*A novel ultra planar, long-stroke and low-voltage piezoelectric micromirror*", J. Micromech. Microeng. 20 (2010) describes a micro-mirror actuated by piezoelectric actuators.

The micro-mirror is fixed to a membrane that can be moved by means of two actuators. A first annular actuator is located at the edge of the membrane and a second annular actuator is located in the central part of the membrane.

One of the actuators applies an upward movement to the membrane and the other actuator applies a downward movement.

The displacement of the membrane is not controlled, in that there is no dynamic control over the position of the membrane, and no means of stopping the membrane.

Stops may be provided to stop the membrane, however reliability problems can arise due to mechanical contact.

Furthermore, since the dimensions of the stops are defined when the membrane is manufactured, they do not enable any dynamic control over the position of the membrane.

PRESENTATION OF THE INVENTION

Consequently, one purpose of this invention is to disclose a membrane device with a dynamically controlled displacement.

The above-mentioned purpose is achieved by a device comprising a suspended membrane, two actuators and means of measuring the membrane position. When one of the actuators forces the membrane into movement, the other actuator controls this movement by applying a force that depends on the position and that may also depend on the membrane velocity and/or acceleration.

In other words, a second actuator is used to keep the membrane in a given position in the case of a dynamic control or to dampen displacement of the membrane.

For example, the means of measuring the membrane position may be capacitive, piezoelectric or piezoresistive.

Very advantageously, means of measuring the membrane position are at least partly supported by the membrane, the membrane device then having a high integration level.

For example, the control means comprise a negative feedback loop that creates damping.

The purpose of this invention is then a membrane device with a support, a membrane suspended on the support, a first actuator in contact with the membrane that will apply a force on the membrane, a second actuator in contact with the membrane that will apply a force on the membrane, means of determining the membrane position relative to the support and control means for the first and second actuators, said control means applying a deformation signal to either the first or the second actuator to displace the membrane and apply a control signal to the other of the first or second actuator to control displacement of the membrane, application of the control signal being determined at least by the position of the membrane.

The membrane does not necessarily displace uniformly. Thus, the displaced membrane may have complex shapes particularly with concave and/or convex parts.

Very advantageously, the means of determining the membrane position are at least partly supported by the membrane.

The control signal may also be determined by the velocity and/or acceleration of the displacement of the membrane.

Preferably, the first and second actuators are of the piezoelectric type.

Other types of actuators can also be used, particularly actuators with a bimetallic strip effect such as thermomechanical actuators.

In one example embodiment, the first and second actuators may then comprise a ferroelectric piezoelectric material, each of the first and second actuators being designed to deform the membrane in an opposite direction.

In another example embodiment, the first and second actuators comprise a non-ferroelectric piezoelectric material, either the first or the second actuator being designed to deform the membrane in opposing first and second directions, and the other second or first actuator being designed to control displacement of the membrane by deforming it in a direction opposite to the deformation induced by the first or second actuator.

The first and the second actuators may comprise a piezoelectric material between two electrodes.

Preferably, the actuator contacts for the first actuator and for the second actuator are made outside the suspended part of the membrane.

In one example embodiment, the membrane is in the form of a disk, the first actuator is in the form of a ring centred on the membrane and the second actuator is in the form of a disk located approximately in a central zone of the membrane.

The membrane is preferably in the form of an approximately circular or even elliptical disk but may be in other shapes, for example it may be square. Furthermore, actuators are preferably arranged concentrically on the membrane and may have different shapes other than circular and elliptical.

The central actuator is not located on the part of the membrane anchored to the support. When this actuator is in the shape of a circular or elliptical disk, it may be solid or hollow and when the external actuator is in the form of a ring, the ring may also be circular or elliptical. Thus, according to the invention, the actuators may have more complex shapes and in particular may comprise sectors electrically connected to each other. In another example embodiment, the membrane is in the form of a disk, the first actuator is annular in shape centred on the membrane, the first actuator comprising a ring and a plurality of approximately trapezoidal shaped ribs connected to the ring at their large base, and the second actuator is in the form of a disk located approximately in a central zone of the membrane.

Preferably, the ratio between the area of the second actuator and the area of the membrane is between 0.2 and 0.5 and the ratio between the area of the part of the first actuator in contact with the membrane and the area of the membrane is preferably between 0.4 and 0.75.

The control means may comprise a negative feedback loop.

The means of determining the membrane position may be of the direct effect piezoelectric type. The means of determining the position of the membrane may be formed by electrodes in the first and/or second actuator, an electrical polarisation under the effect of the membrane deformation being measured between the electrodes of the first actuator and/or between the electrodes of the second actuator.

Alternately, the means of determining the membrane position may be of the capacitive type.

According to the invention, redundancy of the determination means may be made for example using capacitive and/or piezoelectric type means.

The device may comprise a substrate on which the support is transferred, said substrate comprising at least one electrode facing the membrane, the means of determining the membrane position measuring the variation in capacitance between the membrane and said electrode on the substrate As a variant, the means of determining the membrane position are of the piezoresistive type.

The membrane device according to the invention may be made by microelectronic methods.

Another purpose of the invention is a digital speaker comprising at least one membrane device according to the invention.

The digital speaker may advantageously comprise a plurality of micrometric-sized membrane devices.

Another purpose of the invention is a method of controlling actuation of a membrane device according to the invention comprising the following steps:

a) apply a deformation signal to either the first or the second actuator, b) determine the position of the membrane, c) determine a control signal, d) apply said control signal to the other of the first and second actuators.

The deformation signal and the control signal may be voltages.

For example, the membrane position may be determined by measuring a polarisation at the terminals of the first and/or second actuator or the capacitance between the membrane and at least one electrode deposited on the support.

BRIEF DESCRIPTION OF THE DRAWINGS

This invention will be better understood after reading the following description and the appended drawings in which.

DETAILED PRESENTATION OF PARTICULAR EMBODIMENTS

Figure 1A:
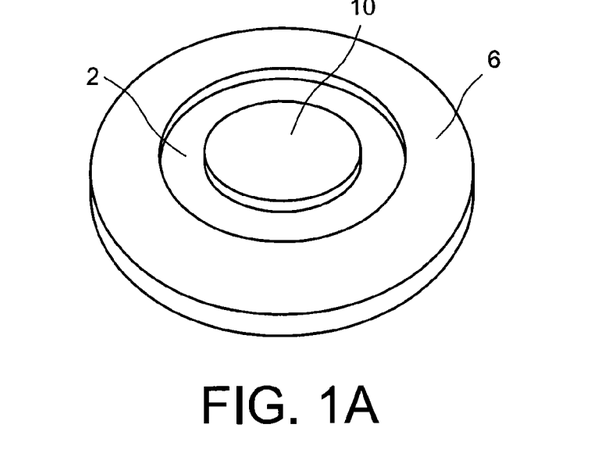
FIGS. 1A and 1B are perspective and sectional views of an example membrane device.
Figure 1B:
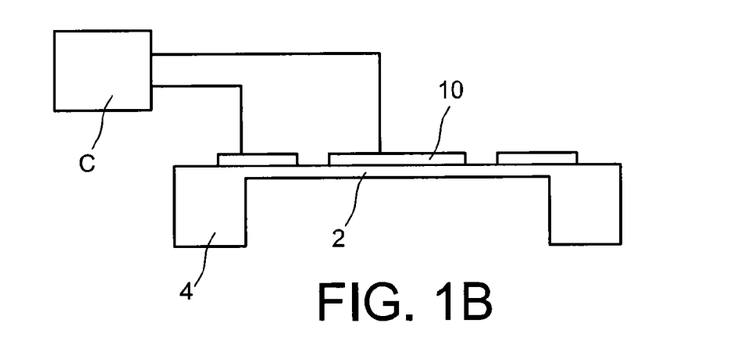

FIGS. 1A and 1B show an example of a membrane device comprising a membrane 2 in the form of a disk suspended on a support 4, a piezoelectric material element 6 in the form of a ring located on an upper face of the membrane 2 and on the outer edge of the membrane 2.

The external periphery of the ring 6 is on the support 4 and the internal periphery is on the membrane 2. The ring is connected to a voltage source or current source 8 as shown diagrammatically in FIGS. 1C and 1D so that it forms a first actuator capable of moving the membrane 2. An electrode is provided for this purpose on each face of the ring 6 to make its connection to the voltage source 8.

The membrane device also comprises a second element made of piezoelectric material 10 in the form of a disk in the example shown, and located in a central part of the upper face of the membrane 2. The disk 10 is also connected to a voltage or current source 12 as shown diagrammatically in FIGS. 1C and 1D so that it forms a second actuator capable of moving the membrane 2. An electrode is provided on each face of the ring to make its connection to the voltage source 8.

As a variant, the actuator may have a different shape, for example a ring.

In another variant, the membrane may be square or rectangular, and in this case the shape of the actuator may be similar to the shape of the membrane but with a different area.

Note that no part of the area of the second actuator is anchored onto the support part.

The first and second actuators may be made with the same piezoelectric materials or with different piezoelectric materials.

Figure 1C:
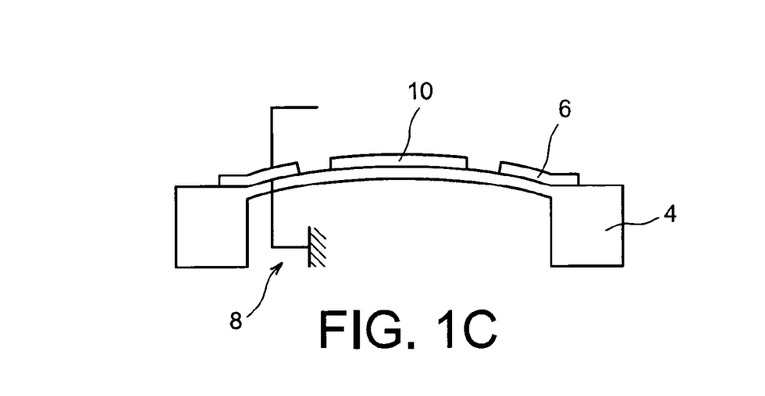
FIGS. 1C and 1D are sectional views of the membrane device in FIGS. 1A and 1B in two different positions.
Figure 1D:
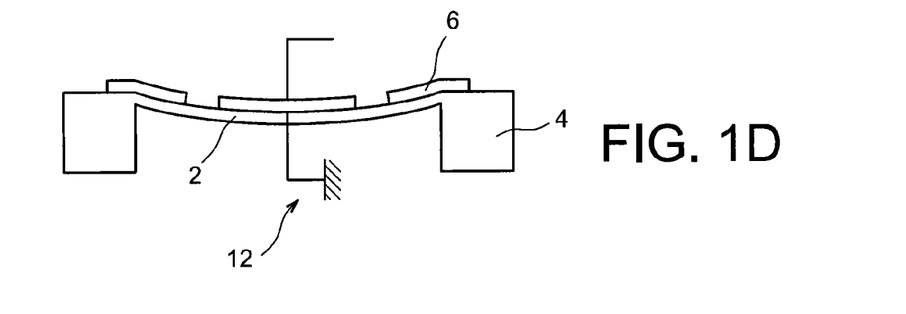

In one example embodiment, the actuators are made from ferroelectric piezoelectric materials such as PZT. Membrane displacements obtained with these actuators are as shown in FIGS. 1C and 1B.

Regardless of the sign of the voltage applied, if its absolute value is greater than the coercitive field of the ferroelectric piezoelectric material, then this material expands in the thickness and contracts radially. Consequently, upward or downward displacements of the membrane are provoked by the shape and position of the actuator on the membrane and not by the sign of the control voltage.

In the example shown, application of a voltage on the first actuator 6 causes an upward displacement of the membrane 2, which is then convex in shape relative to the support 4. Application of a voltage on the second actuator 10 causes a downward displacement of the membrane 2 which is then concave in shape relative to the support 4.

In another example embodiment, actuators are made from non-ferroelectric piezoelectric materials for example such as AlN, ZnO, etc. A positive voltage causes expansion of the piezoelectric material while a negative voltage will induce contraction. Thus, upward and downward displacements may be obtained using a single actuator. In this example embodiment, one actuator may be dedicated to membrane displacements and another actuator may be dedicated to dynamic control of the membrane, deforming it in a direction opposite to the direction of the deformation induced by the other actuator.

The displacement amplitude of the membrane is proportional to the voltage applied to the actuator terminals.

Preferably, the ratio between the area of the second actuator 10 and the area of the membrane 2 is between 0.2 and 0.5 and the ratio between the area of the first actuator 6 located on the membrane 2 and the area of the membrane 2 is between 0.4 and 0.75.

For example, let Rm be the radius of the membrane 2, R1 be the radius of the second actuator 10, and A the width of the annular part of the first actuator 6 located on the membrane 2:

Rm is between 100 µm and 7500 µm, and/or
R1 is between 25 µm and 5000 µm, and/or
A is between 25 µm and 5000 µm.

Figure 3:
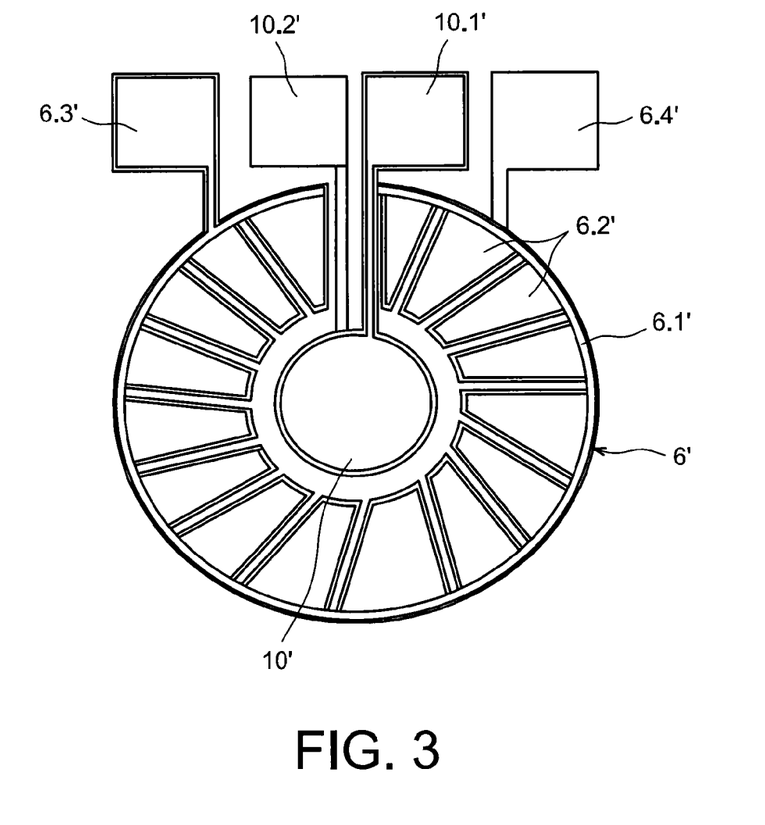
FIG. 3 is a top view of the membrane provided with actuators according to one variant embodiment.

FIG. 3 shows another example embodiment of a device according to the invention in a top view. In this example, the first actuator 6' comprises a ring 6.1' delimiting the outside diameter of the first actuator and a plurality of for example approximately trapezoidal ribs 6.2' connected to the ring at their largest base. The second actuator 10' is in the form of a disk deposited on the central part of the membrane.

Contact pads 6.1', 6.2' of the upper and lower electrodes on the first actuator 6' are shown.

Contact pads 10.1', 10.2' of the upper and lower electrodes on the second actuator 10' are shown.

As a variant, thermal type actuators may be used that will for example heat the membrane and cause its expansion and therefore its displacement.

The membrane device also comprises means of determining the position of the membrane 2 (not shown).

For example, the determination means may be of the piezoelectric, capacitive or piezoresistive type.

Preferably, the means of determining the membrane position are at least partly supported by the membrane, the measurements thus obtained are very precise because they measure the membrane position directly.

In one example embodiment, the determination means measure an electrical polarisation between the electrodes of one or more actuators 6, 10.

The effect of the membrane deformation is to apply a stress on the piezoelectric material that then generates an electrical polarisation, this electrical polarisation is then representative of a given position of the membrane. These means in this example have the advantage of using existing electrodes. The device then has a high integration level.

The measurement may be made between the electrodes of the first actuator and/or the electrodes of the second actuator.

In one variant embodiment in which the membrane 2 and its support 4 are transferred on a support 13 (see FIG. 1E), the determination means are of the capacitive type and measure the capacitance between the membrane 2 and the part of the support 13, for example an electrode 14 facing the membrane 2. The value of the capacitance is directly proportional to the distance separating the membrane 2 from the support 13.

Figure 1E:
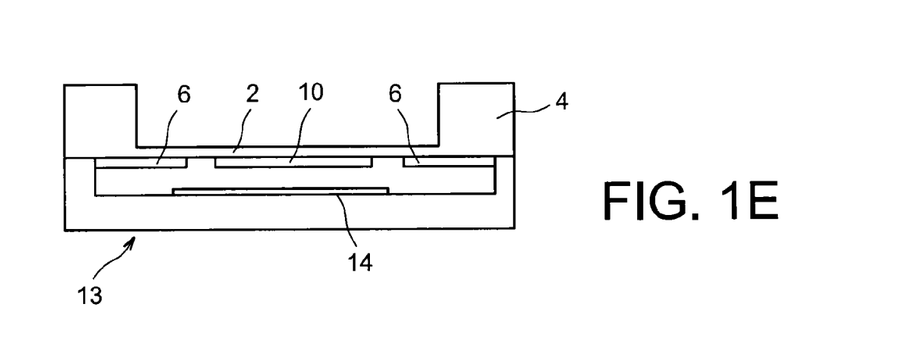
FIG. 1E is a side view of a variant of the membrane device in FIGS. 1A and 1B.
Figure 2:
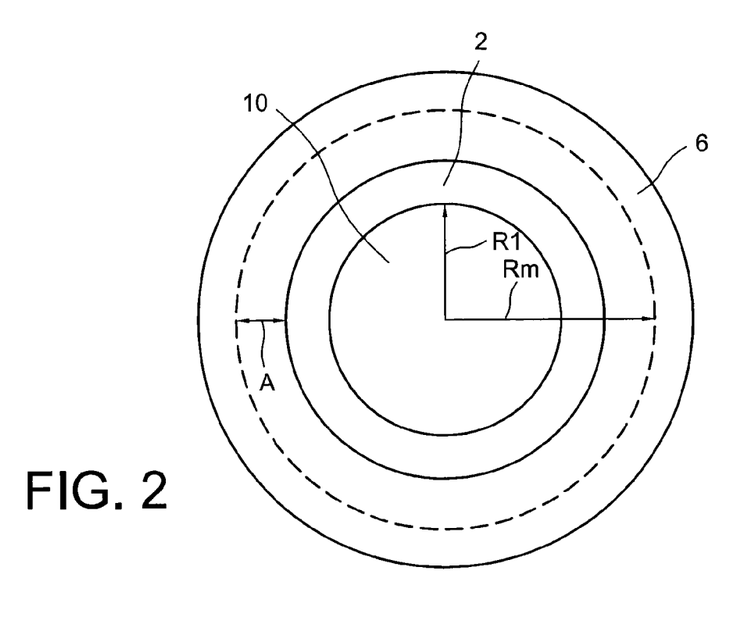
FIG. 2 is a top view of the actuator in FIG. 1A.

The electrical polarisation between two electrodes of either of these two actuators and the capacitance between the membrane and the support 13 can be measured in order to increase the reliability of determination of the membrane position.

The device also comprises control means C shown diagrammatically in FIG. 1B, with one or two actuators 6, 10 depending on the evaluated position of the membrane obtained by the determination means, to slave the position of the membrane by applying a given voltage to one of the actuators.

Figure 4:
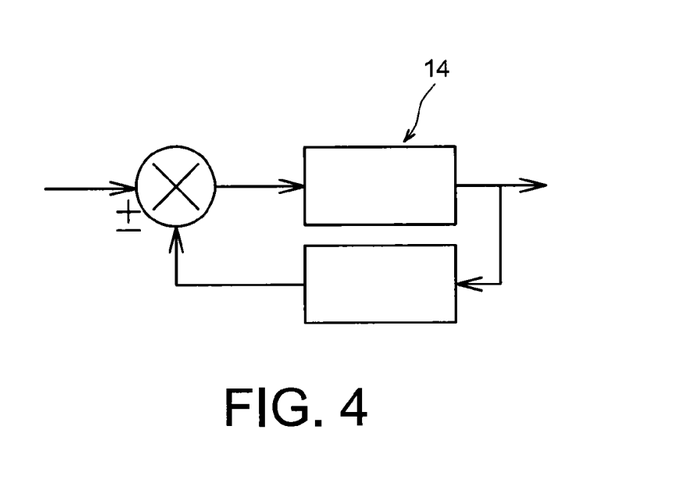
FIG. 4 is an example of a negative feedback loop used in the control of the membrane device.

The control means may comprise a negative feedback loop 14 shown in FIG. 4, which causes damping of the displacement of the membrane. This type of loop is well known to those skilled in the art and will not be described in detail.

Operation of a membrane device according to the state of the art and operation of a membrane device according to the invention will now be disclosed.

Figure 5A:
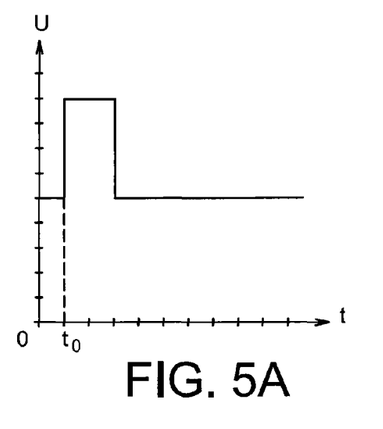
FIGS. 5A and 5B are graphic views of the voltage control of the actuator of a membrane device according to the state of the art and the displacement velocity of the membrane respectively.
Figure 5B:
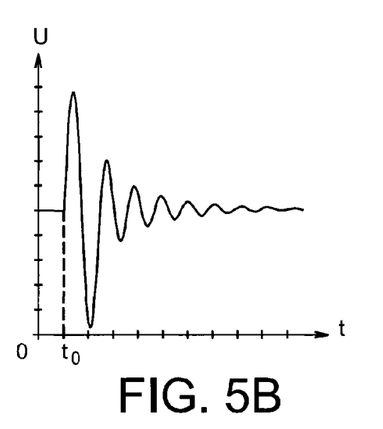

FIG. 5A graphically shows a notch-shaped control voltage U as a function of time t for a membrane device according to the state of the art comprising two actuators controlled separately, the external actuator causing upward displacement of the membrane and the internal actuator causing downward displacement of the membrane. Such a device does not comprise any means of controlling the membrane displacement. FIG. 5B shows the variation of the velocity V at the centre of the membrane of such a device as a function of time t.

It can be seen that at time t0 at which a voltage is applied to the actuator, the membrane velocity increases strongly towards its second position, and then reduces with secondary lobes. Therefore the membrane oscillates until the energy supplied by the actuator is dissipated. Therefore this shows that the membrane stop point is not controlled.

Figure 6A:
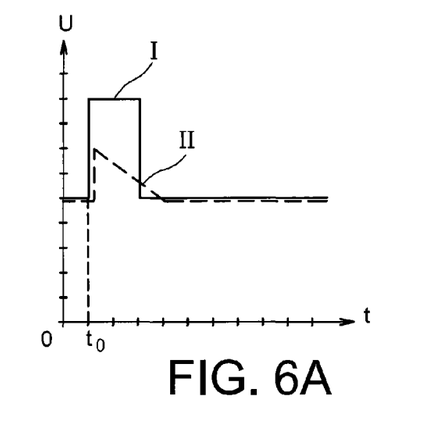
FIGS. 6A and 6B are graphic views of the voltage control of the actuator of a membrane device according to the invention and the displacement velocity of the membrane respectively.
Figure 6B:
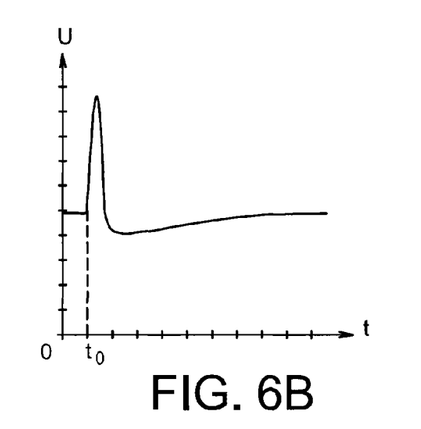

FIG. 6A shows voltage control signals U emitted by the control means of a membrane device according to this invention, as a function of time t. We will consider a device like that shown in FIGS. 1A to 1D, the piezoelectric material of the actuators being ferroelectric. The first actuator 6 causes upward displacement of the membrane 2 and the second actuator 10 causes downward displacement of the membrane 2.

Signal I is the signal applied to the first actuator 6 and signal II is the signal applied to the second actuator 10.

During a first step, signal I is applied to the first actuator 6. The membrane is deformed upwards in the view shown in FIG. 1D.

During the next step, the position of the membrane 2 is evaluated by determination means, either by measuring the electrical polarisation between the two electrodes of at least one of the actuators, or by measuring the capacitance between the membrane and the substrate.

During a next step, a signal II to be applied to the second actuator 10 is determined as a function of the position of the membrane 2 and the control to be applied to the membrane 2 and the signal II is applied to the second actuator 10 at time t corresponding to the required position of the membrane.

If there is a predictive model of the behaviour of the membrane, the signal II may be determined directly from information about the membrane position.

If this model is not present, position measurements may be differentiated a first time to obtain the velocity and then a second time to obtain the acceleration of the membrane, signal II will then for example be determined based on the acceleration because the acoustic pressure to be controlled is directly proportional to the acceleration of the membrane.

In the example shown in FIG. 6A, signal II is applied to the second actuator shorter after signal I is applied to the first actuator, signal II being such that its effect is to stiffen the membrane. The result of the application of signal II is that secondary lobes are eliminated in the velocity response at the centre of the membrane.

If signal I is maintained on the first actuator 6 while signal II is applied to the second actuator 10, the membrane 2 is kept in the deformed position obtained by the first actuator 6 due to the action of the second actuator 10.

If signal I is not maintained when signal II is applied on the second actuator 10, membrane 2 returns to its equilibrium position but is damped.

Note that the membrane 2 has a high velocity at t0 and is quickly damped. The position of the membrane 2 is then precisely controlled.

Operation is similar when signal I is applied to the second actuator 10 to displace the membrane and signal II is applied to the first actuator to control the membrane displacement.

This shape of the velocity signal induces an acceleration and therefore a similar shape pressure signal without secondary pressure lobes, which is particularly suitable for a digital speaker in which secondary pressure lobes are a hindrance to sound reproduction.

Figure 8A:
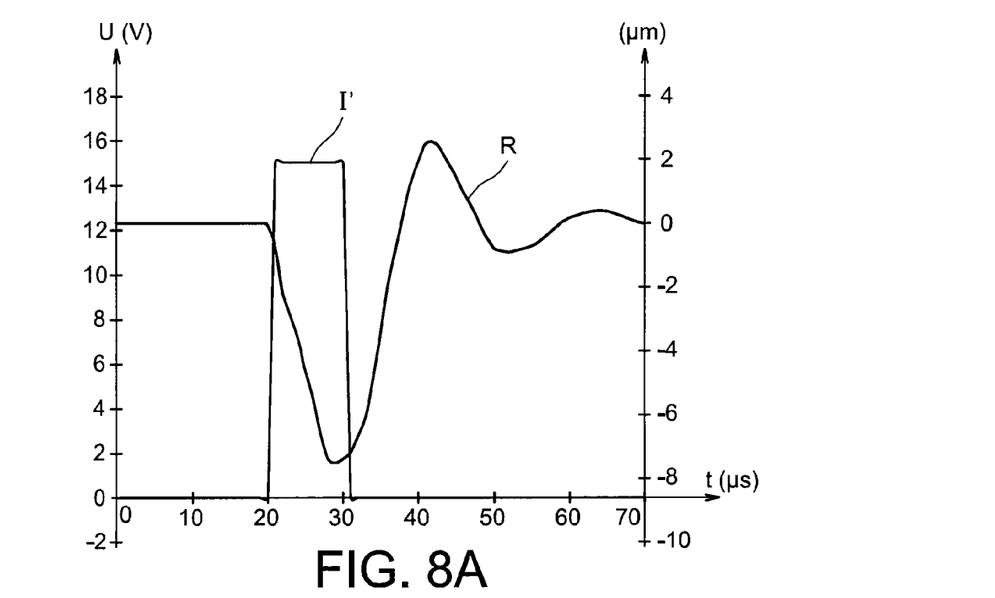
FIG. 8A is a graphic view of a displacement signal applied to a membrane device according to the state of the art and the membrane response as a function of time.

FIG. 8A shows another example of a finite element simulation of the membrane response in the case of a device provided only with an internal actuator. The left ordinate axis represents the voltage in V and the right ordinate axis represents the displacement in μm. Curve I' represents the signal applied to the actuator and curve R represents the displacement of the membrane with time.

Figure 8B:
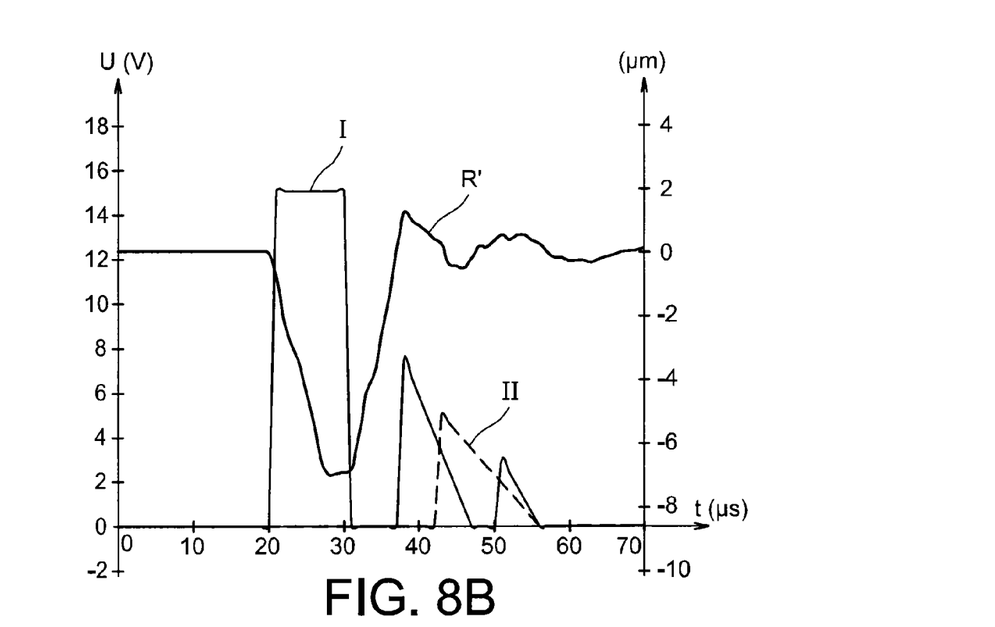
FIG. 8B is a graphic view of signals applied to the actuators of a membrane device according to this invention and the membrane response as a function of time.

FIG. 8B shows another example of a finite element simulation of the membrane response in the case of a signal I more complex than that shown in the simulation in FIG. 6A. The curve R' represents the membrane displacement with time.

In this simulation, signal I is applied to the second actuator 10 and the control signal II is applied to the first actuator 6. In this example, signal II is applied about 22 μs after signal I.

A reduction in secondary lobes can be seen.

According to the invention, the dynamic response of the membrane can be refined by adjusting the initial actuation pulse, as on the counter reaction pulse. The combination of these pulses can eliminate secondary lobes.

For example, the membrane control law can be determined by making a finite element simulation study of the membrane response as a function of the amplitude and duration of signals and the time between signals.

It will be understood that voltage signal shapes and their amplitudes or time offsets are not limited to the case shown by the graphic representations in FIGS. 6A and 8A.

For example, the elapsed time between when signals I and II are applied may be between 5 μs and 5 ms.

The control signal for the second actuator is fixed as a function of the evaluation of the membrane position obtained depending on the case by capacitive measurement or by the electrical polarisation measurement.

In the example embodiment in which the piezoelectric material of the actuators is not ferroelectric, one of the actuators may be used only for upward and downward displacements of the membrane depending on the sign of the voltage applied to the actuator, and the other actuator may be used only to regulate the position of the membrane.

In a system comprising a plurality of membrane devices, signals may be applied to each device separately, or to groups of devices or to all devices as a function of the use of such a system.

For example, in the case of a digital speaker, sound is reproduced by added elementary contributions of speaklets. In some cases no speaklets will be actuated, in other cases a certain percentage of speaklets will be actuated, and in other cases all speaklets will be actuated. The membrane device according to the invention may be used in many technical fields. For example, it may be used to make a pressure sensor or a pressure generator, a more efficient digital speaker because with the invention, the parasite vibration of the membrane is reduced which improves the resulting sound, an ultrasound pulse generator like cMUTs, medical objects required to deliver a very precise quantity of product, possibly in a given time like an insulin pump, etc., in ultrasound imagery, in making RF components such as a variable capacitance for which it is required to precisely control the value of the capacitance in time.

An example embodiment of a membrane device will now be disclosed. The steps are shown diagrammatically in FIGS. 7A to 7F.

Figure 7A:
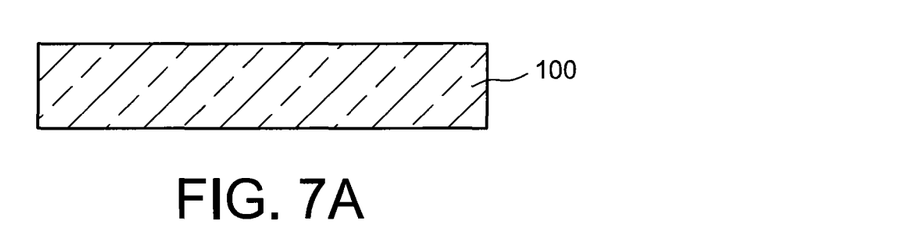
FIGS. 7A to 7F are diagrammatic views of the different steps in an example embodiment of a membrane device according to the invention.

For example, a silicon substrate 100 is used as shown in FIG. 7A.

A thermal oxidation of the substrate is done during a first step so as to form an oxide layer 102 on all surfaces of the substrate with for example a thickness of 2 μm. A hard oxide mask 104 is then deposited on the back face of the substrate. For example, the thickness of this mask is 5 μm, the mask is made by turning the substrate over; it is possible to deposit the mask on this face only, depending on the composition of the chosen deposit. For example, it may be a PVD (Physical Vapour Deposition) type deposit The back face may then be etched to reach the silicon.

Figure 7B:
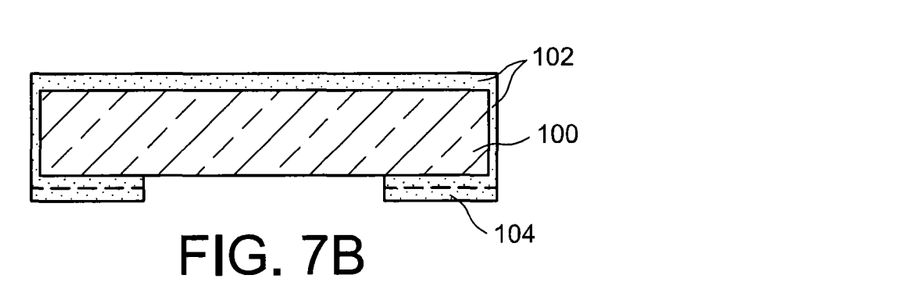

The element thus obtained is shown in FIG. 7B.

During a next step, a layer 106 is formed on the front face that will form the membrane 2. This layer is for example made of polysilicon, SiC or $SiO_2$. The thickness of the layer 106 may for example be between a few hundred nm to several urn, of even several tens of μm.

For example, the layer 106 may be made by chemical vapour deposition (CVD) or epitaxial growth. The stresses in the layer 106 are preferably controlled.

Figure 7C:
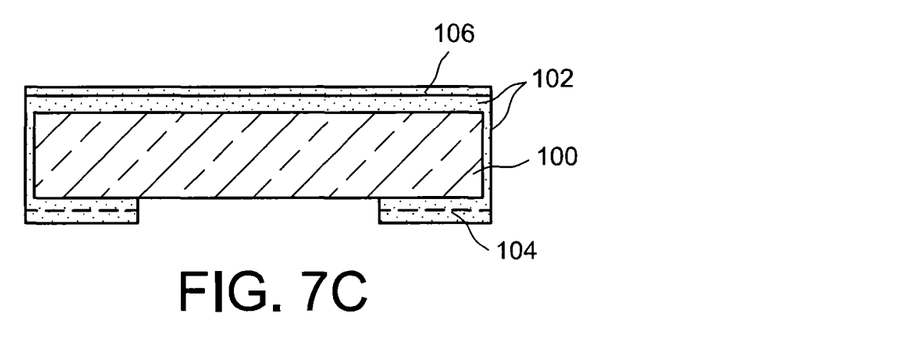

The element thus obtained is shown in FIG. 7C.

During a next step, a layer 108 is formed on the layer 106 for example made of $SiO_2$ or SiN. The layer 108 may for example have a thickness of between a few hundred nm and several μm, the layer 108 is formed for example by thermal oxidation or CVD deposition.

Figure 7D:
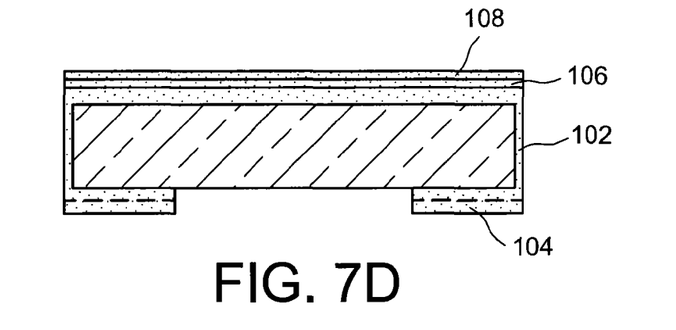

The element thus obtained is shown in FIG. 7D.

During a next step, the first and second actuators are made.

This is done by firstly making a layer 110 that will form the lower electrodes of the actuators, for example made of Pt, Mo. The layer 110 may for example be made by deposition on the layer 108. The layer 110 may have a thickness for example of between a few tens of nm and a few hundred nm.

A layer of piezoelectric material 112 is then deposited on the layer 110, for example made of PZT, AlN, ZnO, LNO with a thickness for example of between a few hundred nm to a few μm.

The upper electrode is then made by formation of a layer 114 on the piezoelectric material 112, for example made of Ru, Au with a thickness for example of between a few tens of nm to a few hundred nm.

Preferably, an additional layer 116 for example made of gold is deposited on the layer of upper electrodes that will be in contact with the contacts on the upper electrodes.

The next step is an etching step.

A stepped profile is preferably made. This is obtained because all layers are deposited and then etched from the upper layer, using different photolithography masks, the second mask being wider than the first, etc. This leaves safety margins to prevent overlapping layers, which may occur due to uncertainty in the positioning of masks. This thus prevents any short circuit between the electrodes.

In the example shown and advantageously, contact pads 18 of the lower electrode on the outer edge of the lower electrode may for example be made simultaneously. The conducting materials of the upper electrode are also stacked on the lower electrode, so that there is not too much difference in thickness between the pads of the lower and upper electrodes. Characterisation problems can occur if the difference is too large.

Figure 7E:
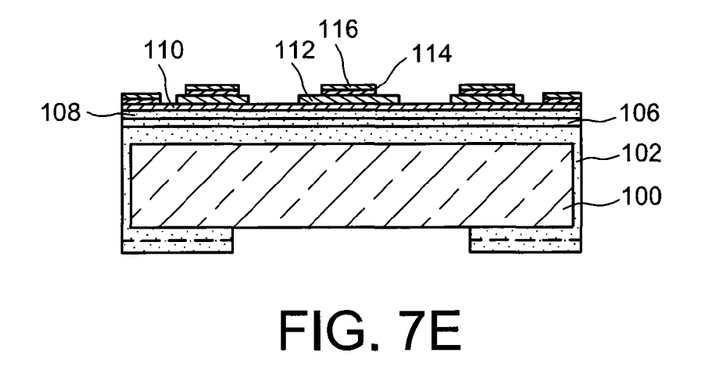

The element thus obtained is shown in FIG. 7E. The contact pads are for example contact pads 6.3', 6.4' and 10.1', 10.2' shown diagrammatically in FIG. 3.

The next step is to etch the lower electrode and then the layer 108 for example using the same photolithography mask. Etching is stopped on the membrane 106

Finally, the membrane is released by deep etching of the substrate from the back until the membrane is reached.

Figure 7F:
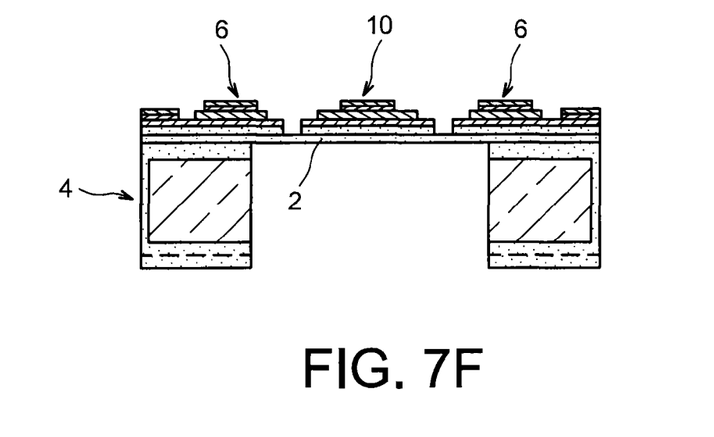

The membrane device thus obtained is shown in FIG. 7F, which comprises the membrane 2 suspended on the support 4 and the first annular actuator 6 and the second disk-shaped actuator 10. This device is connected to the control means described above.

Such a method can be used to make a large number of membrane devices according to the invention on a small area, which makes the device and method particularly suitable for making a digital speaker.

The invention claimed is:

1. A membrane device comprising:
   a support,
   a membrane suspended on the support,
   a first actuator in contact with the membrane and configured to apply a force on the membrane, wherein part of the first actuator is on the support and another part of the first actuator is on the membrane suspended from the support,
   a second actuator in contact with the membrane and configured to apply a force on the membrane,
   a position sensor configured to determine a position of the membrane relative to the support, and
   a controller coupled to the first and second actuators, and to the position sensor, said controller being programmed to apply a deformation signal to one of the first and second actuators to displace the membrane, programmed to detect a position of the membrane from the position sensor during application of the deformation signal, and programmed to apply a control signal to the other of the first and second actuators to control displacement of the membrane, wherein application of the control signal is determined at least by the detected position of the membrane relative to the support.

2. The membrane device according to claim 1, wherein the position sensor is least partly supported by the membrane.

3. The membrane device according to claim 1, wherein said control signal is also determined by velocity and/or acceleration of the membrane displacement determined by the detected position.

4. The membrane device according to claim 1, wherein the first and second actuators are piezoelectric actuators, each of the first and second actuators comprising a piezoelectric material arranged between two electrodes.

5. The membrane device according to claim 4, wherein the first and second actuators comprise a ferroelectric piezoelectric material, each of the first and second actuators being designed to deform the membrane in an opposite direction.

6. The membrane device according to claim 4, wherein the first and second actuators comprise a non-ferroelectric piezoelectric material, one of the first and second actuators being designed to deform the membrane in a first and second opposite directions, and the other of the first and second actuators being designed to control displacement of the membrane by deforming the membrane in a direction opposite to the direction of the deformation induced by the other actuator.

7. The membrane device according to claim 1, wherein the membrane is in the form of a disk, the first actuator is in the form of a ring centered on the membrane and the second actuator is in the form of a disk approximately located in a central zone of the membrane.

8. The membrane device according to claim 1, wherein the membrane is in the form of a disk, the first actuator is annular in shape centered on the membrane, the first actuator comprising a ring and a plurality of approximately trapezoidal shaped ribs connected to the ring at their large base, and the second actuator is in the form of a disk located approximately in a central zone of the membrane.

9. The membrane device according to claim 1, wherein the controller comprises a negative feedback loop.

10. The membrane device according to claim 1, wherein the position sensor is a capacitive position sensor.

11. The membrane device according to claim 10, comprising a substrate on which the support is transferred, said substrate comprising at least one electrode facing the membrane, the position sensor measuring a variation in capacitance between the membrane and said electrode on the substrate.

12. The membrane device according to claim 1, wherein the position sensor is a piezoelectric position sensor.

13. The membrane device according to claim 12, wherein the first and second actuators are piezoelectric actuators, each of the first and second actuators comprising a piezoelectric material arranged between two electrodes and in which the position sensor is formed by electrodes of the first and/or second actuators, an electrical polarisation being measured under an effect of the membrane deformation between the electrodes of the first actuator and/or between the electrodes of the second actuator.

14. The membrane device according to claim 1, wherein the position sensor is a piezoresistive position sensor.

15. A digital speaker comprising at least one membrane device according to claim 1.

16. The digital speaker according to claim 15, comprising a plurality of micrometric sized membrane devices.

17. A method of controlling actuation of a membrane device according to claim 1, comprising the following steps:
   applying the deformation signal to one of the first and second actuators,
   determining the detected position of the membrane with respect to the support during said applying the deformation signal,
   determining the control signal based on said detected position of the membrane,
   applying said control signal to another of the first and second actuators.

18. An actuation method according to claim 17, wherein the deformation signal and the control signal are voltages.

19. The actuation method according to claim 17, wherein the position of the membrane is determined by measuring an electrical polarisation at terminals of the first and/or second actuators and/or by measuring capacitance between the membrane and at least one electrode formed on the support.

\* \* \* \* \*